US012811393B2

(12) United States Patent
Abessolo Bidzo et al.

(10) Patent No.: US 12,811,393 B2
(45) Date of Patent: Nov. 24, 2026

(54) COMMUNICATION CIRCUIT HAVING A TERMINATION RESISTANCE CIRCUIT WITH ESD CIRCUITRY

(71) Applicant: NXP B.V., Eindhoven (NL)

(72) Inventors: Dolphin Abessolo Bidzo, Nijmegen (NL); Chinmayee Kumari Panigrahi, Bangalore (IN); Marcin Grad, Bemmel (NL); Paul Hendrik Cappon, Wijchen (NL)

(73) Assignee: NXP B.V., Eindhoven (NL)

( * ) Notice: Subject to any disclaimer, the term of this patent is extended or adjusted under 35 U.S.C. 154(b) by 202 days.

(21) Appl. No.: 18/661,043

(22) Filed: May 10, 2024

(65) Prior Publication Data

US 2025/0192546 A1 Jun. 12, 2025

(30) Foreign Application Priority Data

Dec. 7, 2023 (IN) ............................ 202341083395

(51) Int. Cl.
*H02H 9/04* (2006.01)
*H03H 11/28* (2006.01)

(52) U.S. Cl.
CPC ............ *H02H 9/046* (2013.01); *H03H 11/28* (2013.01)

(58) Field of Classification Search
CPC .... H02H 9/046; H03H 11/28; H04L 25/0278; H04L 25/0298; H10D 89/611; H10D 89/911; H10D 89/921
See application file for complete search history.

(56) References Cited

U.S. PATENT DOCUMENTS

| | | | |
|---|---|---|---|
| 5,374,861 | A | 12/1994 | Kubista |
| 6,762,620 | B2 | 7/2004 | Jang et al. |
| 7,215,156 | B1 | 5/2007 | Li |
| 7,250,660 | B1 | 7/2007 | Huang et al. |

(Continued)

FOREIGN PATENT DOCUMENTS

| | | |
|---|---|---|
| CN | 101751902 A | 6/2010 |
| CN | 103633945 A | 3/2014 |

OTHER PUBLICATIONS

Bae, J., "A 1V 2.8Gbps 0.18μm CMOS inverter-based digital differential transmitter with calibrations of termination and mismatch", 2008 International SoC Design Conference, DOI: 10.1109/SOCDC.2008.4815643, Nov. 24-25, 2008.

(Continued)

*Primary Examiner* — Thienvu V Tran
*Assistant Examiner* — Muaamar Qahtan Al-Taweel
(74) *Attorney, Agent, or Firm* — David G. Dolezal

(57) ABSTRACT

A communication circuit includes a termination circuit with multiple termination blocks where the termination circuit is coupled to a die terminal for conveying a signal. Each termination block includes a resistive circuit and a switch for selectively implementing the resistance of the resistive circuit in the termination resistance of the communication circuit. Each block includes a string of one or more diodes coupled to the resistive circuit and to the selection switch. The string of one or more diodes is nonconductive during normal operation and is conductive during an ESD event affecting the die terminal to discharge the ESD current to a supply voltage terminal when the selection switch is nonconductive.

19 Claims, 6 Drawing Sheets

(56) References Cited

U.S. PATENT DOCUMENTS

| | | | | |
|---|---|---|---|---|
| 7,773,355 | B2 | 8/2010 | Ma et al. | |
| 8,037,370 | B2 | 10/2011 | Glen | |
| 8,116,048 | B1 | 2/2012 | Gallerano et al. | |
| 8,134,813 | B2 | 3/2012 | Karp | |
| 8,829,618 | B2 | 9/2014 | Pok et al. | |
| 9,111,675 | B1 | 8/2015 | Kireev | |
| 9,154,126 | B2 | 10/2015 | Nierop et al. | |
| 9,338,036 | B2 | 5/2016 | Poulton et al. | |
| 9,576,915 | B2 | 2/2017 | Huang et al. | |
| 9,800,153 | B2 | 10/2017 | David | |
| 9,894,733 | B1 | 2/2018 | Buthker et al. | |
| 9,979,188 | B2 | 5/2018 | Mu | |
| 10,008,948 | B1 | 6/2018 | Strijker | |
| 10,014,856 | B2 | 7/2018 | Uchida et al. | |
| 10,200,091 | B2 | 2/2019 | Ding et al. | |
| 10,382,098 | B2 | 8/2019 | Hueber et al. | |
| 10,516,445 | B2 | 12/2019 | Hueber et al. | |
| 10,971,458 | B2 | 4/2021 | Liu | |
| 11,088,876 | B1 | 8/2021 | Farjadrad | |
| 11,190,372 | B2 | 11/2021 | Muth et al. | |
| 11,581,875 | B1 | 2/2023 | Mai et al. | |
| 12,323,275 | B2 | 6/2025 | Sacki | |
| 2001/0024348 | A1* | 9/2001 | May | H10D 89/611 361/56 |
| 2002/0080537 | A1* | 6/2002 | Landy | H10D 89/601 361/56 |
| 2003/0039084 | A1* | 2/2003 | Hatzilambrou | H10D 89/611 361/56 |
| 2004/0027742 | A1* | 2/2004 | Miller | H10D 89/921 361/111 |
| 2004/0161276 | A1 | 8/2004 | Richardson | |
| 2005/0057866 | A1 | 3/2005 | Mergens et al. | |
| 2006/0217079 | A1* | 9/2006 | Yu | H04L 25/0278 455/78 |
| 2007/0121263 | A1 | 5/2007 | Liu et al. | |
| 2007/0153445 | A1* | 7/2007 | O'Mahony | H03K 5/15013 361/600 |
| 2007/0164883 | A1 | 7/2007 | Furtner | |
| 2008/0242246 | A1 | 10/2008 | Minnis et al. | |
| 2009/0027145 | A1 | 1/2009 | Kim et al. | |
| 2010/0020952 | A1 | 1/2010 | Leung et al. | |
| 2011/0026173 | A1 | 2/2011 | Karp | |
| 2012/0176720 | A1 | 7/2012 | Tsai | |
| 2012/0229940 | A1 | 9/2012 | Wu et al. | |
| 2014/0132592 | A1 | 5/2014 | Liu et al. | |
| 2014/0144240 | A1* | 5/2014 | Barlow | B06B 1/0215 73/632 |
| 2015/0078420 | A1 | 3/2015 | Guerts et al. | |
| 2015/0355664 | A1 | 12/2015 | Mitsuishi et al. | |
| 2016/0126729 | A1* | 5/2016 | Gerdemann | H02H 9/046 361/56 |
| 2016/0190673 | A1 | 6/2016 | Huang et al. | |
| 2017/0317070 | A1* | 11/2017 | Salcedo | H04B 1/40 |
| 2018/0083442 | A1* | 3/2018 | Lamar | H02H 9/041 |
| 2018/0359005 | A1 | 12/2018 | Ding et al. | |
| 2019/0214378 | A1* | 7/2019 | Franck | G01R 31/002 |
| 2020/0219828 | A1 | 7/2020 | Kin | |
| 2020/0366276 | A1 | 11/2020 | Shinoda | |
| 2021/0006430 | A1 | 1/2021 | De Haas | |
| 2023/0077591 | A1 | 3/2023 | Farjadrad | |
| 2024/0263996 | A1 | 8/2024 | Mikajiri | |
| 2025/0192078 | A1 | 6/2025 | Syed et al. | |
| 2025/0192546 | A1 | 6/2025 | Abessolo Bidzo et al. | |
| 2025/0193056 | A1 | 6/2025 | Abessolo Bidzo et al. | |

OTHER PUBLICATIONS

Zhang, G., "An accurate current source with on-chip self-calibration circuits for low-voltage differential transmitter drivers", 2003 IEEE International Symposium on Circuits and Systems (ISCAS), DOI: 10.1109/ISCAS.2003.1205931, May 25-28, 2003.

Notice of Allowance dated Aug. 5, 2025 in U.S. Appl. No. 18/661,089.

U.S. Appl. No. 18/661,089, filed May 10, 2024, entitled "Differential Transmitter Circuitry With ESD Circuitry".

Dovale, L., "A Programmable and Low-Area On-Die Termination for High-Speed Interfaces", 2019 IEEE 10th Latin American Symposium on Circuits & Systems (LASCAS), Feb. 24-27, 2019.

Yeoh, T., "ESD effects on power supply clamps [CMOS ICs]", Proceedings of the 1997 6th International Symposium on the Physical and Failure Analysis of Integrated Circuits, Jul. 25, 1997.

* cited by examiner

COMMUNICATION CIRCUIT HAVING A TERMINATION RESISTANCE CIRCUIT WITH ESD CIRCUITRY

CROSS-REFERENCE TO RELATED APPLICATIONS

This application claims the priority under 35 U.S.C. § 119 of India application no. 202341083395, filed on 7 Dec. 2023, the contents of which are incorporated by reference herein.

BACKGROUND OF THE INVENTION

Field of the Invention

This invention relates to communications circuits having termination circuitry with ESD protection.

Background

Some semiconductor integrated circuits utilize electrostatic discharge (ESD) devices for discharging charge from an ESD event affecting a die terminal. An ESD event may occur when a charged object (e.g., a human finger) inadvertently contacts a conductive surface of an integrated circuit die (e.g., a contact pad or other die terminal) or a conductive surface of an integrated circuit package coupled to the pad where charge at an elevated voltage is applied to the conductive surface due to the contact. Being at an elevated voltage, such charge may cause voltage differentials across the devices of the integrated circuit that may exceed their safe operating area voltages and damage those devices. An ESD event may also occur when a charged conductive surface of a circuit contacts an external object where charge is transferred between the conductive surface and the external object.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In one embodiment, a communication circuit includes a termination circuit with multiple termination blocks where the termination circuit is coupled to a die terminal for conveying a signal. Each termination block includes a resistive circuit and a switch for selectively implementing the resistance of the resistive circuit in the termination resistance of the communication circuit. Each block includes a string of one or more diodes coupled to the resistive circuit and to the selection switch. The string of one or more diodes is nonconductive during normal operation and is conductive during an ESD event affecting the die terminal to discharge the ESD current to a supply voltage terminal when the selection switch is nonconductive.

One advantage of providing a termination circuit with selectable termination blocks each including a string of one or more diodes for discharging ESD current is that it may allow for a reduction of ESD circuitry on the signal line of the die terminal, thereby reducing the capacitance on the signal line. This reduction in capacitance may be beneficial for improving the performance of a communication circuit, especially those with signal lines that convey high operating frequencies (e.g., 1000 MHz and above).

Figure 1:
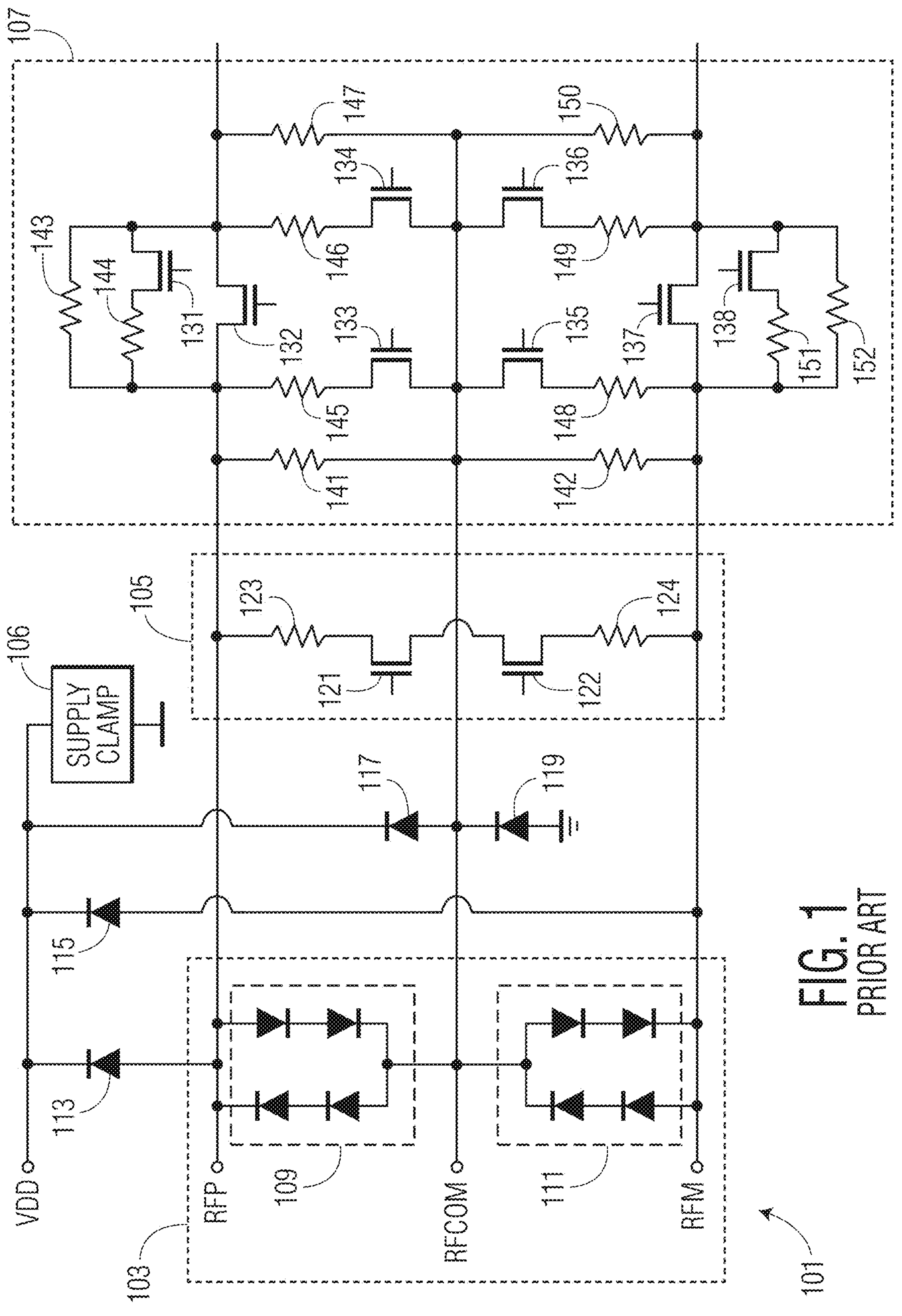
FIG. 1 PRIOR ART
FIG. 1 is a circuit diagram of a portion of a prior art communications circuit.

FIG. 1 is a circuit diagram of a portion of a prior art communications circuit of an integrated circuit. Integrated circuit 101 includes three signal die terminals RFP, RFM, and RFCOM as well as a VDD die terminal. A differential signal can be conveyed at die terminals RFP, RFM. and RFCOM with a three-wire transmission bus. The RFCOM terminal is a virtual ground. Integrated circuit 101 also includes a termination circuit 107 with resistors 141-152 and selection switches 131-138. Selection switches 131-138 are selectively made conductive to set the termination resistance of circuit 107. Integrated circuit 101 also includes an attenuator 105 for attenuating the conveyed signal. Attenuator 105 includes transistors 121 and 122 and resistors 123 and 124.

Integrated circuit 101 includes ESD circuitry for protecting its internal circuitry (e.g., attenuator 105, termination circuit 107, and other circuitry not shown) during ESD events. Diodes 113, 115, 117 and 119, supply clamp 106, and ESD circuit 103 are used for discharging ESD current from ESD events affecting die terminals VDD, RFP, RFCOM, and RFM.

In FIG. 1, ESD circuit 103 includes a diode string circuit 109 that includes two strings of two diodes in an antiparallel configuration that are connected between die terminal RFP and die terminal RFCOM. ESD circuit 103 includes diode string circuit 111 that includes two strings of two diodes in an antiparallel configuration that are connected between die terminal RFM and die terminal RFCOM. These diode strings are configured to conduct ESD current during an ESD event affecting any one of the die terminals RFP, RFM, and RFCOM so as to reduce the excessive voltage difference across the terminals that could damage the internal circuitry of integrated circuit 101 coupled across the terminals (e.g., transistors 121 and 122, termination switches 133-136, and other circuitry not shown).

However, the parasitic capacitance of the diodes of string circuits 109 and 111 can degrade the performance of the communications circuit (e.g., reduce the data rate or bandwidth of the data transferred on signal lines RFP and RFM). This degradation is even more pronounced in that the input capacitance at the junction of the ESD protection circuitry is nonlinear (voltage dependent). The effect of this parasitic capacitance becomes more problematic at higher operating frequencies (e.g., 1000 MHz and above).

Figure 2:
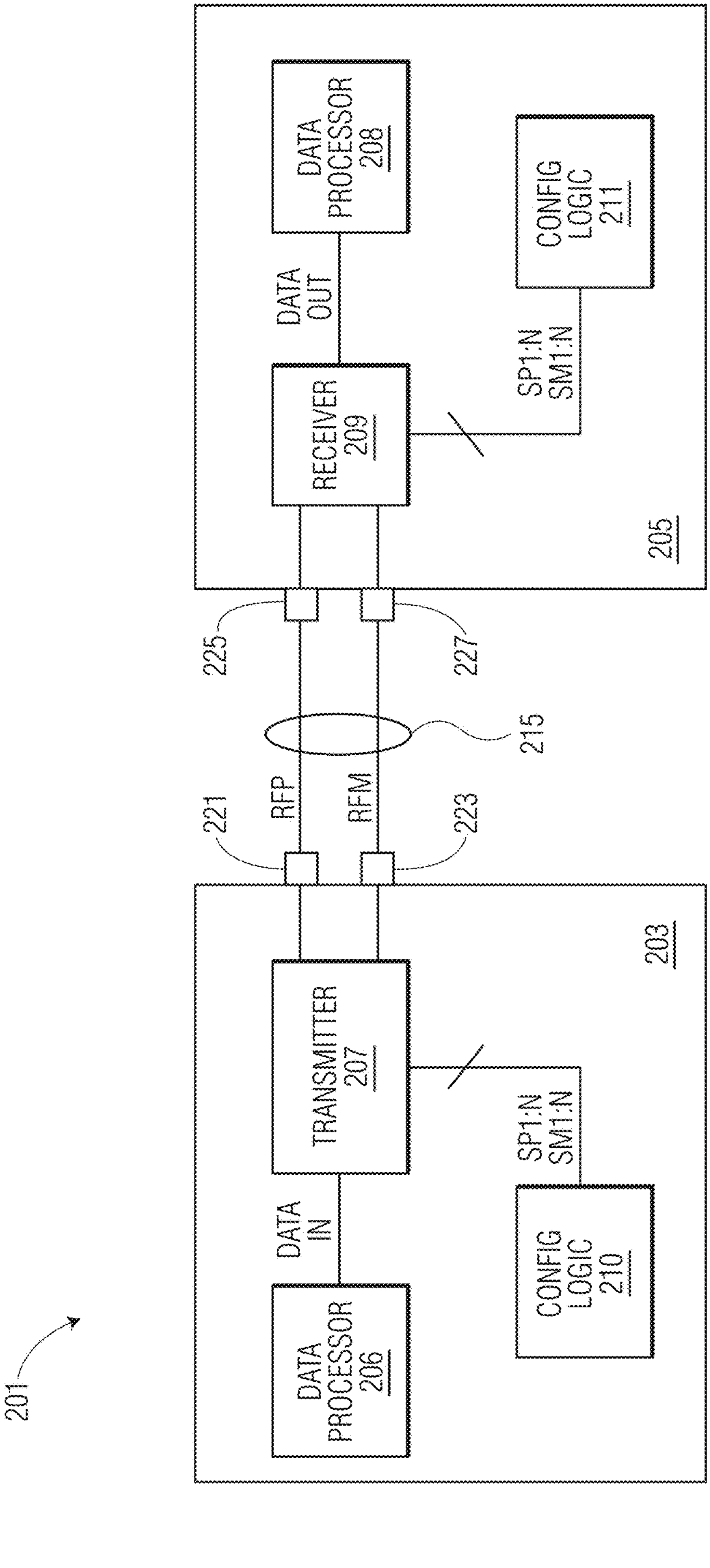
FIG. 2 is a block diagram of two circuits located on a transmission bus according to one embodiment of the present invention.

FIG. 2 is a block diagram of a communication system 201 that includes two circuits 203 and 205 communicatively coupled to provide data transmission over a two-wire transmission bus 215 according to one embodiment of the present invention. Circuit 203 includes a data processor 206, a transmitter 207, and configuration logic 210. Transmitter 207 receives data (DATA IN) from data processor 206 that is to be transmitted on transmission bus 215. Prior to transmitting the data, transmitter 207 encodes and modulates the data for transmission on bus 215 as per a data communications protocol such as the Universal Serial Bus (USB) protocol. In some embodiments, the data transmission over bus 215 is characterized as a Low Voltage Differential Signaling (LVDS) transmission. Receiver 209 receives data from transmission bus 215 and demodulates and decodes the data to provide to data processor 206 as DATA OUT for further processing. Circuit 205 also includes configuration logic 212. In other embodiments, the data may be transmitted by other communications protocols such as by other serial communications protocols.

In the embodiment shown, circuit 203 and circuit 205 are implemented in two sperate integrated circuits. Circuit 203 includes two die terminals 221 and 223 (e.g., bond pads, bumps, posts) that are connected to transmitter 207 and connected to signal lines RFP and RFM, respectively of two-wire transmission bus 215. Signal lines RFP and RFM are connected to die terminals 225 and 227, respectively, of circuit 205. Die terminals 225 and 227 are connected to receiver 209 of circuit 205.

In one embodiment, circuit 203 and circuit 205 are integrated in the same integrated circuit package where signal lines RFP and RFM are implemented in package conductors such as wirebonds or signal traces. In other embodiments, circuit 203 and circuit 205 would each be implemented in separate integrated circuit packages where die terminals 221 and 223 and signal lines RFP and RFM would each be connected to the package terminals (not shown) of the integrated circuit package (not shown) of circuit 203. Die terminals 225 and 227 and signal lines RFP and RFM would each be connected to the package terminals (not shown) of the integrated package of circuit 205. In such an embodiment, transmission bus 15 may be implemented as traces on a circuit board which implements both the integrated circuit of circuit 203 and the integrated circuit of circuit 205. In some embodiments, at least a portion of the transmission bus 215 may be implemented with a cable such as a twisted pair cable.

Configuration logic 210 provides selection signals (SP1:N, SM1:N) to termination circuits (431 and 433 in FIG. 4), respectively, to set the termination resistance for lines RFP and RFM, respectively, in transmitter 207. Configuration logic 212 provides selection signals (SP1:N, SM1:N) to termination circuits (331 and 333 in FIG. 3), respectively, to set the termination resistance for transmission lines RFP and RFM, respectively, in receiver 209. A termination resistance is the resistance at the end of a transmission path. Typically, the termination resistance is sized to closely match the characteristic impedance of the transmission path to minimize reflections of the transmitted signal.

In one embodiment, system 201 is used to implement a Wi-Fi RF front end system where circuit 203 is part of a host type that generates data for transmission and circuit 205 includes a Wi-Fi transmitter (not shown) for wirelessly transmitting the received data after further processing. In other embodiments, system 201 can be used to test high speed USB communication (e.g., USB3) with a common mode logic receiver and transmitter. In some embodiments, the operating frequency of the data transmission is 1000 MHz or greater (e.g., in the range of 5000 MHz-6000 MHz such as 5500 MHz) and with data rates at or above 1 Gbps (e.g., 5.5 Gbps). However, system 201 may operate at other frequencies and at other data rates in other embodiments.

In other embodiments, both circuit 203 and 205 may include a transceiver that is able to send and receive data over bus 215. In some embodiments, system 201 may include two busses where each bus is unidirectional. In such an embodiment, each circuit would include a transmitter and receiver.

Figure 3:
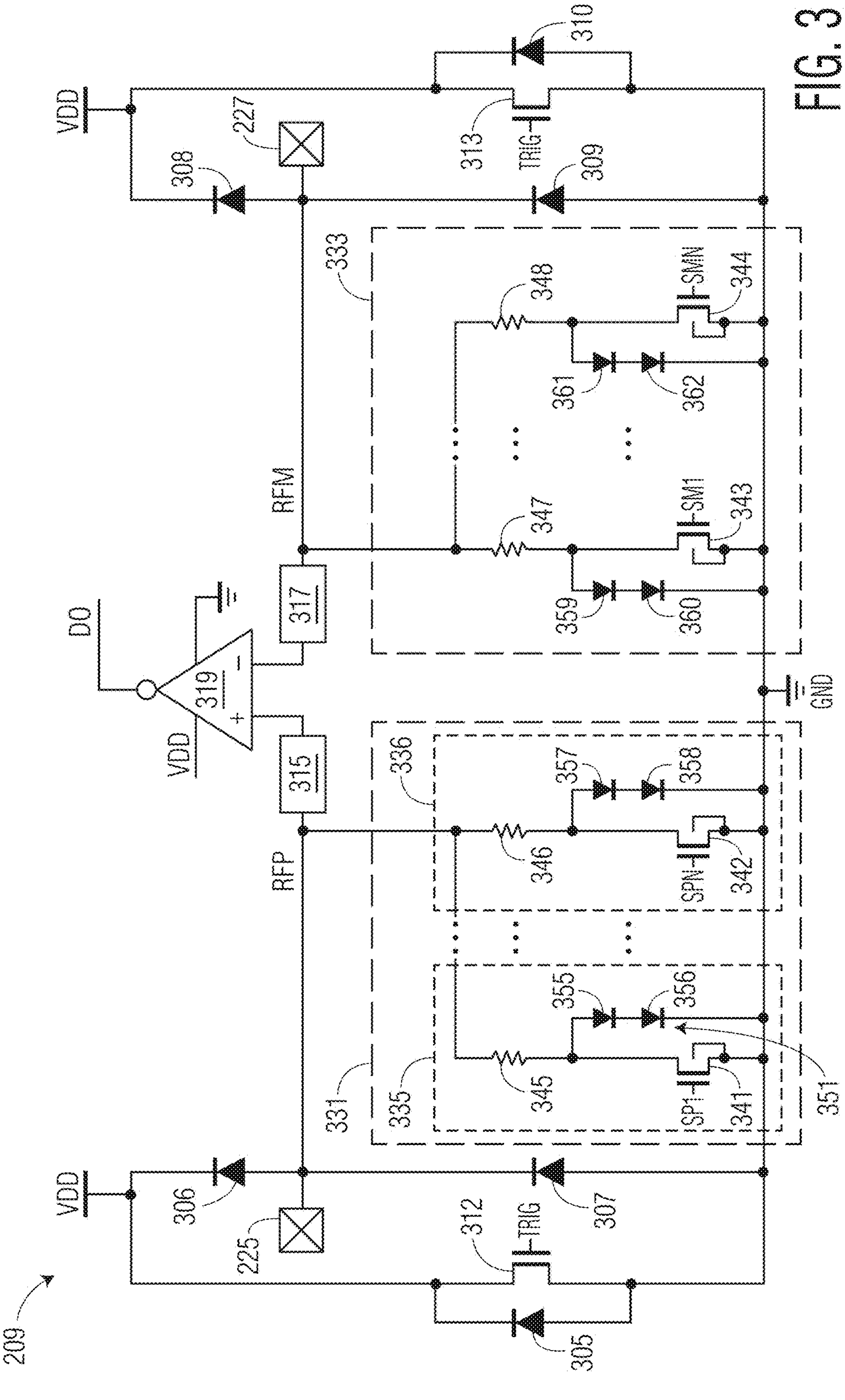
FIG. 3 is a circuit diagram of a portion of a receiver according to one embodiment of the present invention.

FIG. 3 is a circuit diagram of a portion of receiver 209 according to one embodiment of the present invention. Receiver 209 includes a differential amplifier 319, termination circuits 331 and 333, and ESD circuitry for protecting the circuitry of receiver 209 from ESD events affecting die terminals 225 and 227 and the supply voltage die terminals connected to a VDD supply voltage and a ground (GND) supply voltage. The non inverting terminal (+) of differential amplifier 319 is coupled to die terminal 225 (through ESD circuit 315) to receive the RFP signal, and the inverting terminal (−) is coupled to die terminal 227 (through ESD circuit 317) to receive the RFM signal. The RFP and RFM signals are characterized as a differential signal and are complementary to each other. Amplifier 319 compares the RFP and RFM signals to determine the signal state of the differential signal at its output DO.

Diodes 305-310 are utilized to discharge ESD current from the ground die terminal to the VDD die terminal for an ESD event affecting the ground die terminal where the voltage of the ground die terminal is elevated above the VDD die terminal by a threshold voltage. Clamp circuits (NFETs 312 and 313) are utilized to discharge ESD current from the VDD die terminal to the ground die terminal when a trigger signal (TRIG) is asserted. The trigger signal is asserted by a trigger circuit (not shown) when it detects an ESD event affecting the VDD die terminal. During normal operation (when no ESD event is occurring), diodes 305-310 and clamp circuits (NFETs 312 and 313) do not conduct. ESD circuits 315 and 317 provide additional ESD discharge paths for ESD events at the VDD die terminal and the ground die terminal. See the discussion of FIG. 6 below for more details on ESD circuit 315.

Receiver 209 includes termination circuit 331 for setting the termination resistance of the RFP signal line at receiver 209 and includes termination circuit 333 for setting the termination resistance of the RFM signal line at receiver 209. In the embodiment, shown, each termination circuit includes a number (N) of termination blocks of which at least one block that can be selectively implemented to set the termination resistance of a signal line. In FIG. 3, circuit 331 is shown as including two termination blocks 335 and 336. However, other embodiments may include a greater number of termination blocks (e.g., 3, 6, 12, 16). Each block (335, 336) of circuit 331 includes a resistive circuit (345, 346) having a terminal connected to the RFP signal line and connected to a selection switch (implemented with NFETs 341 and 342 in FIG. 3) of the block. When enabled by a selection signal (SP1, SPN), the selection switch of the block enables a path from signal line RFP, through the resistive circuit (345, 346) of the block, thought the conductive selection switch of the block, to the ground terminal to implement the resistance of the resistive circuit in the termination resistance of signal line RFP. For example, selection signal SP1 is set to make NFET 341 conductive such that the resistance of resistive circuit 345 is implemented in the terminal resistance of signal line RFP at receiver 209. The selection signals (SP1, SPN) are selectively asserted to enable one or more blocks of circuit 331 to set the termination resistance at a desired value from a number of possible values.

In the embodiment of FIG. 3 where the selection switch of a block is implemented with an NFET (341, 342), the drain of the NFET is connected to a terminal of the resistive circuit (345, 346), the source of the NFET is connected to the ground die terminal, and the gate of the NFET is connected to configuration logic to receive an asserted-high selection signal. The body terminal of the NFET is connected to its source. However, other types of switches may be used in other embodiments. In some embodiments, a termination circuit may include a resistive circuit (not shown) coupled in parallel with the termination blocks (335, 336) whose resistance is a default termination resistance if no selection switch is enabled. In one embodiment, each resistive circuit is implemented with one or more polysilicon resistors (not shown) to provide the desired resistance of the termination block, but other types of resistors may be used in other embodiments.

Each termination block (335, 336) includes a string of one of more diodes that discharges at least a portion of the ESD current from an ESD event affecting die terminal 225 when the selection switch of the block is nonconductive. For example, block 335 includes a diode string of diodes 355 and 356 connected in a cathode to anode configuration wherein the cathode of diode 355 is connected to the anode of diode 356. The anode of diode 355 is connected to a terminal of resistive circuit 345 and to the drain of NFET 341. The cathode of diode 356 is connected to the ground terminal. Block 336 includes a diode string of diodes 357 and 358.

During an ESD event of a sufficient voltage affecting die terminal 225 when NFET 341 is nonconductive, ESD current from terminal 225 flows through resistive circuit 345 and through diodes 355 and 356 to the ground terminal to discharge the ESD current to protect NFET 341 from excessive damage due to the high voltage of the ESD event. ESD current flows through termination block 336 in a similar manner during the ESD event.

Because termination circuit 331 includes multiple termination blocks, ESD current of an event affecting terminal 225 is discharged through multiple circuit paths, thereby providing a greater amount of ESD discharge capacity. Furthermore, the amount ESD current flowing through any one block is reduced to minimize the possibility of damage to the switch of the block.

During normal operation, the diode string of a termination block is configured not to conduct. When the voltage at the anode of the first diode in the string (diodes 355 and 357) begins to rise above the cumulative voltage threshold of a diode string during an ESD event, ESD current begins to flow through the diode string to the ground terminal. In one embodiment, the cumulative threshold voltage of a diode string is the sum of the threshold voltages of the serially configured diodes of the string.

The cumulative threshold voltage of a diode string is set at a value that is below the safe operating area voltage of the switch of the block under ESD like circumstances but above the highest possible voltage across the switch during normal operation (plus some operating margin). In one embodiment, where the highest possible voltage during normal operation between the current terminals of NFET 341 is 0.9V and the safe operating area voltage of NFET 341 is 1.5 volts, the cumulative threshold voltage is set at a value in between (e.g., 1.3 volts). The desired cumulative threshold voltage is also set based on a voltage at which ESD protection is desired to trigger. In one embodiment, the cumulative threshold voltage of a diode string is set based on the characteristics of the diodes in the string and on the number of diodes in the string.

In one embodiment, utilizing the block resistive circuit (345) in the ESD discharge path allows for a lower voltage selection switch to be used as well as a lesser amount of diodes in a diode string to be used. During an ESD event, part of the ESD voltage of terminal 225 is dropped across the block resistive circuit, thereby reducing the voltage across the selection switch during an ESD event. Such a reduction in voltage may also reduce the probability of damage to the selection switch and allow for a lower voltage transistor to be used for the selection switch.

In some embodiments, the resistive circuit (345, 346) of each block would have a different resistance than the resistive circuits of the other blocks of termination circuit 331. For example, in one embodiment, the resistive circuit resistances of the blocks range from 62.5 ohms to 1 K ohm. The variation in resistances enables for a finer adjustment in setting the termination resistance. In such embodiments, the current carrying capacity of a diode string of a block may be designed to carry an amount of current corresponding to amount of ESD current flowing through the termination block relative to the total amount of ESD current flowing through all of the termination blocks of a termination circuit (331) during an ESD event. For example, if the resistance of resistive circuit 345 is twice as large as the resistance of resistive circuit 346, then block 336 would be expected to discharge twice as much ESD current as block 335. Accordingly, the diode string of block 336 would be designed to carry twice as much current as the diode string of block 335. In one embodiment, the current carrying capability of a diode string is defined by the diode of the string with the smallest current capability.

In some embodiments, reducing the current capability of the diode strings for the blocks with the larger resistive circuits may reduce the total amount of parasitic capacitance of the diode strings thereby reducing the amount of parasitic capacitance on the RFP signal line during normal operation (operation during a non ESD event). Such a reduction in parasitic capacitance may lead to an improved performance of the communication circuit (receiver, transmitter, transceiver) implementing the termination circuit.

In the embodiment of FIG. 3, there are two diodes per diode string. However, other embodiments may include a different number of diodes per string (e.g., 1, 3 or greater). In one embodiment, the diodes of the termination circuit are implemented with gated diodes (where the gate is connected to the anode or cathode of the diode). However, other types of diodes may be used in other embodiments such as e.g., shallow trench insulator (STI) diodes. In some embodiments, gated diodes may exhibit a lower voltage overshoot than other types of diodes such as an STI diode. This is particularity advantageous for protection against fast ESD transients.

Distributing the ESD current-discharge diode strings in the current termination blocks also allows for a distribution of the ESD-diode current carrying capacity among multiple, smaller current carrying diode strings instead of one large current carrying diode string that would be connected to both the RFP signal line and ground. If a selection switch of a block is conductive during normal operation due to the block being selected for termination resistance implementation, then the capacitance of the diode string of the selected block would not affect the RFP signal line in that both terminals of the diode string of the selected block are shorted to the ground terminal. Accordingly, the total effect of the parasitic capacitance of the ESD circuitry during normal operation is reduced in that some of the ESD diode strings of the selected blocks are "disabled" over a system where a single, large current carrying capacity diode string is connected to the signal line RFP and ground terminal.

Termination circuit 333 is connected to signal line RFM and operates in a similar manner to termination circuit 331. Termination circuit 333 include a number of blocks including diodes (359-362), resistive circuits (347, 348), and selection switches (343, 344). In some embodiments, selection signals SM1-SMN may originate from the same signal lines from logic 212 as selection signals SP1-SPN. In other embodiments, they may originate from different signal lines from logic 212.

One advantage of the receiver of FIG. 3 is that there is no direct ESD discharge path (e.g., diodes or clamps) between signal line RFP and signal line RFM. Accordingly, the capacitive coupling is reduced between the signal lines allowing for a higher operating frequency and a faster data rate.

Figure 4:
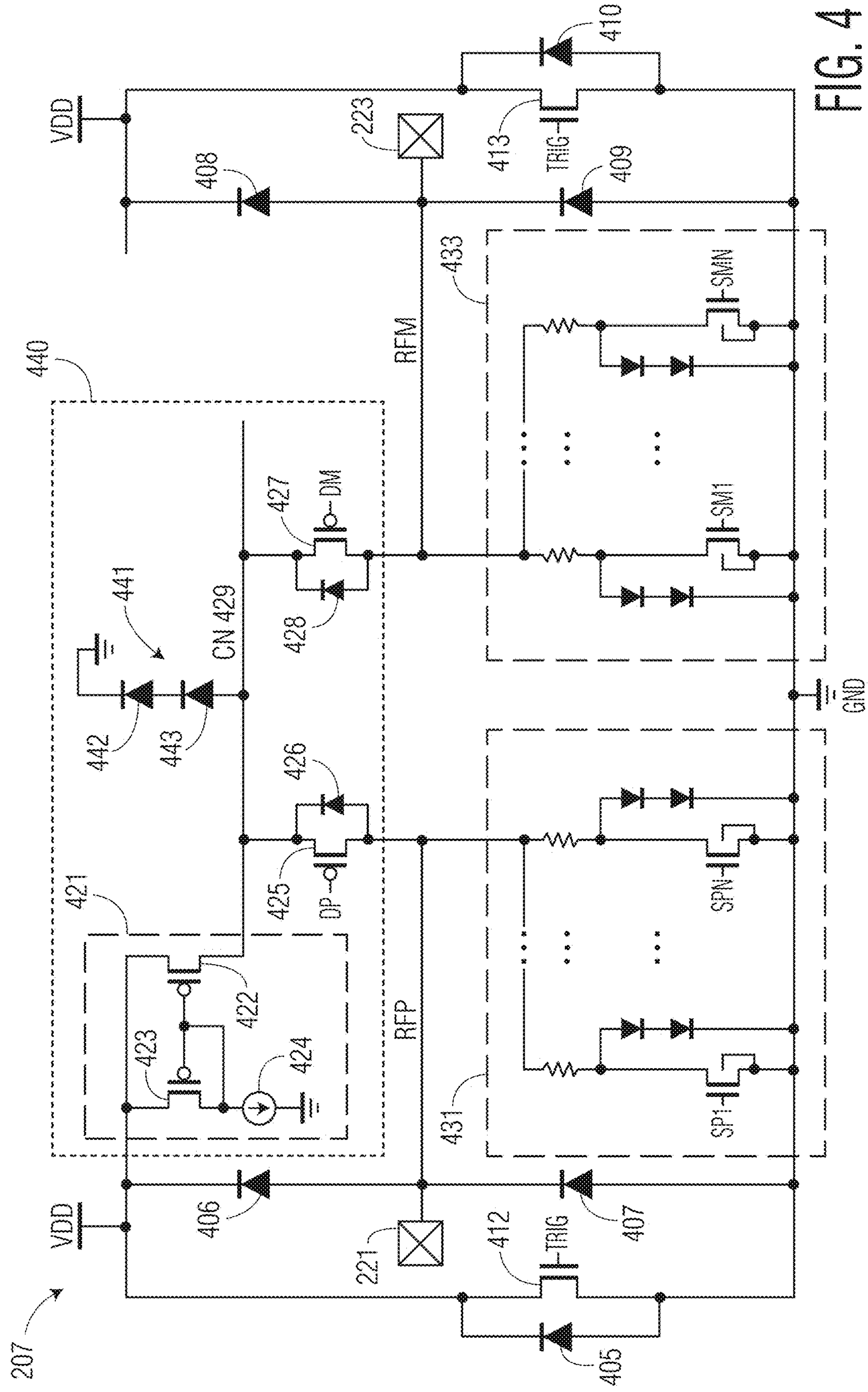
FIG. 4 is a circuit diagram of a portion of a transmitter according to one embodiment of the present invention.

FIG. 4 is a circuit diagram of a portion of transmitter 207 according to one embodiment of the present invention. Transmitter 207 includes transmitting circuitry 440, termination circuits 431 and 433, and ESD circuitry for protecting the circuitry of transmitter 207 from ESD events at die terminals 221 and 223 and the supply voltage die terminals connected to a VDD and ground (GND) voltage supplies (not shown).

Diodes 405-410 are utilized to discharge ESD current from the ground die terminal to the VDD die terminal for an ESD event affecting the ground die terminal where the voltage of the ground die terminal is elevated above the VDD die terminal by a threshold voltage. Clamp circuits (NFETs 412 and 413) are utilized to discharge ESD current from the VDD die terminal to the ground die terminal when the trigger signal (TRIG) is asserted. The trigger signal is asserted by a trigger circuit (not shown) when it detects an ESD event affecting the VDD die terminal. During normal operation (when no ESD event is occurring), the diodes and clamp circuits do not conduct.

Circuit 203 includes termination circuit 431 for setting the termination resistance of the RFP signal line at transmitter 207 and includes termination circuit 433 for setting the termination resistance of the RFM signal line at transmitter 207. Termination circuits 431 and 433 are similar to termination circuits 331 and 333 of FIG. 3 in that they each include a plurality of termination blocks with diode strings for discharging ESD current from ESD events affecting die terminal 221 and die terminal 223. Note that the VDD and ground die terminals of transmitter 207 may be connected to the same VDD and ground voltage supplies as receiver 209 or different VDD and ground voltage supplies than receiver 209.

Transmitter 207 includes transmitting circuitry 440 for driving a differential signal with complementary signals RFP and RFM at terminals 221 and 223, respectively. Transmitting circuitry 440 includes drive transistor 425 for driving the RFP signal on die terminal 221 and transistor 427 for driving the RFM signal on die terminal 223. In the embodiment shown, drive transistor 425 is implemented with a PFET whose drain terminal is connected to die terminal 221. The source terminal of the PFET of transistor 425 is connected to common node 429. The gate of the PFET of transistor 425 is connected to receive a data signal DP from other circuitry of transmitter 207 (not shown). In the embodiment shown, drive transistor 427 is implemented with a PFET whose drain terminal is connected to die terminal 223. The source terminal of the PFET of transistor 427 is connected to common node 429. The gate of the PFET the transistor 427 is connected to receive a data signal DM from other circuitry of transmitter 207 (not shown).

Transmitter circuitry 440 includes a current circuit 421 that provides a regulated current to common node 429. Circuit 421 includes a current source 424 that provides a regulated current that is mirrored to the common node 429 by a current mirror of PFETs 422 and 423 in a current mirror configuration with the source of PFET 422 being connected to the VDD die terminal and the drain of PFET 422 being connected to the common node 429. Current circuit 421 may have other configurations, include other circuitry, and/or include other types of transistors in other embodiments.

During a transmitting operation, complementary signals DP and DM are asserted and non asserted as per the encoded data to be transmitted. For example, when signal DP is at an asserted low state and signal DM is at a nonasserted high state, transistor 425 is conductive and transistor 427 is nonconductive such that the current from current circuit 421 (via common node 429) is steered to terminal 221 and not terminal 223 where signal RFP is driven to a high signal state and signal RFM is driven to a low signal state. When signal DM is at an asserted low state and signal DP is at a nonasserted high state, transistor 427 is conductive and transistor 425 is nonconductive such that the current from current circuit 421 (via common node 429) is steered to terminal 223 and not terminal 221 where signal RFM is driven at a high signal state and signal RFP is driven at a low signal state. In other embodiments, the transistor circuitry 440 may have other configurations, other circuitry, and/or other types of transistors.

Providing drive current to both drive transistors 425 and 427 from a common node (as opposed each drive transistor having its own current source) provides for a lower noise transmitter, which is especially important for high operating frequencies and high data rates and/or low transmitting voltages. However, having both drive transistors coupled to a common node may expose the drive transistors to potential damage due to ESD events affecting the signal terminals. For example, an ESD event affecting terminal 221 could potentially damage transistor 427 in that the voltage differential during an ESD event affecting terminal 221 may cause the voltage differential between common node 429 and die terminal 223 to rise above the safe operating area voltage of transistor 427.

A possible solution for minimizing damage from an ESD event affecting one of the differential signal die terminals is to include antiparallel diode strings (not shown) connecting the signal die terminals together. However, the parasitic capacitance of the antiparallel diode strings would degrade the performance of the transmitter, especially at high operating frequencies, high data rates and/or low voltage signaling.

Transmitter 207 includes ESD protection circuitry for protecting its internal circuitry (e.g., drive transistors 425 and 427) from an ESD event affecting the signal die terminals. Transmitter 207 includes a diode string 441 of diodes 443 and 442 arranged in a cathode to anode configuration with the anode of diode 443 connected to common node 429, the cathode of diode 443 connected to the anode of diode 442, and the cathode of diode 442 connected to the ground terminal.

Diode 426 is connected to the common node 429 at its cathode and to die terminal 221 at its anode. Diode 428 is connected to the common node 429 at its cathode and to die terminal 223 at its anode. In some embodiments, diodes 426 and 428 are body diodes of transistors 425 and 427, respectively, where the body connection of the PFETs are connected to common node 429 such that the anode of the intrinsic body diode 426 of transistor 425 is connected to die terminal 221 and the cathode is connected to common node 429 and such that the anode of the intrinsic body diode 428 of transistor 425 is connected to die terminal 223 and the cathode is connected to common node 429. In other embodiments, diodes 426 and 428 would be separate devices extrinsic to transistors 425 and 427, respectively.

When an ESD event affects die terminal 221 and raises the voltage of die terminal 221 above a specific threshold voltage, ESD current is discharged from terminal 221 through diode 426, through common node 429, and through diode string 441 to the ground terminal. Consequently, an ESD event affecting die terminal 221 will not raise the voltage of common node 429 to a volage such the source-drain voltage of transistor 427 is above its safe operating area voltage. When an ESD event affects die terminal 223 and raises the voltage of die terminal 223 above a specific threshold voltage, ESD current is discharged from die terminal 223 through diode 428, through common node 429, and through diode string 441 to the ground terminal. Consequently, and ESD event affecting terminal 223 will not raise the voltage of common node 429 to a voltage such the source-drain voltage of transistor 425 is above its safe operating area voltage.

In one embodiment, the cumulative threshold voltage of string 441 is above the voltage differential between VDD and ground so that string 441 will not conduct during normal operation, but low enough where it will conduct before the voltage on the common node 429 is above the safe operating area voltage of transistors 425 and 427. In embodiments where VDD is 0.9 volts and the safe operating area voltage of transistors 425 and 427 is 1.5 volts, the cumulative threshold voltage of string 441 would be somewhere in between (e.g., 1.2 volts).

In some embodiment, diodes 442 and 443 of are gated diodes, but may be of other types of diodes (STI diodes) in other embodiments. In other embodiments the string 441 may include a different number of diodes (e.g., one or greater than two).

In some embodiments, providing a transmitter with drive transistors coupled to a common node and having a string of one of more diodes coupled to the common node to provide an ESD discharge current path, may allow for differential-signal drive transistors to receive current from a common node for improved transistor performance while minimizing the effect of the capacitance of the ESD protection. This can be especially beneficial for transmitters operating at high frequencies.

One advantage of the receiver of FIG. 4 is that there is no direct ESD discharge path (e.g., diodes or clamps) between signal line RFP and signal line RFM. Accordingly, the capacitive coupling is reduced between the signal lines allowing for a higher operating frequency and a faster data rate.

Figure 5:
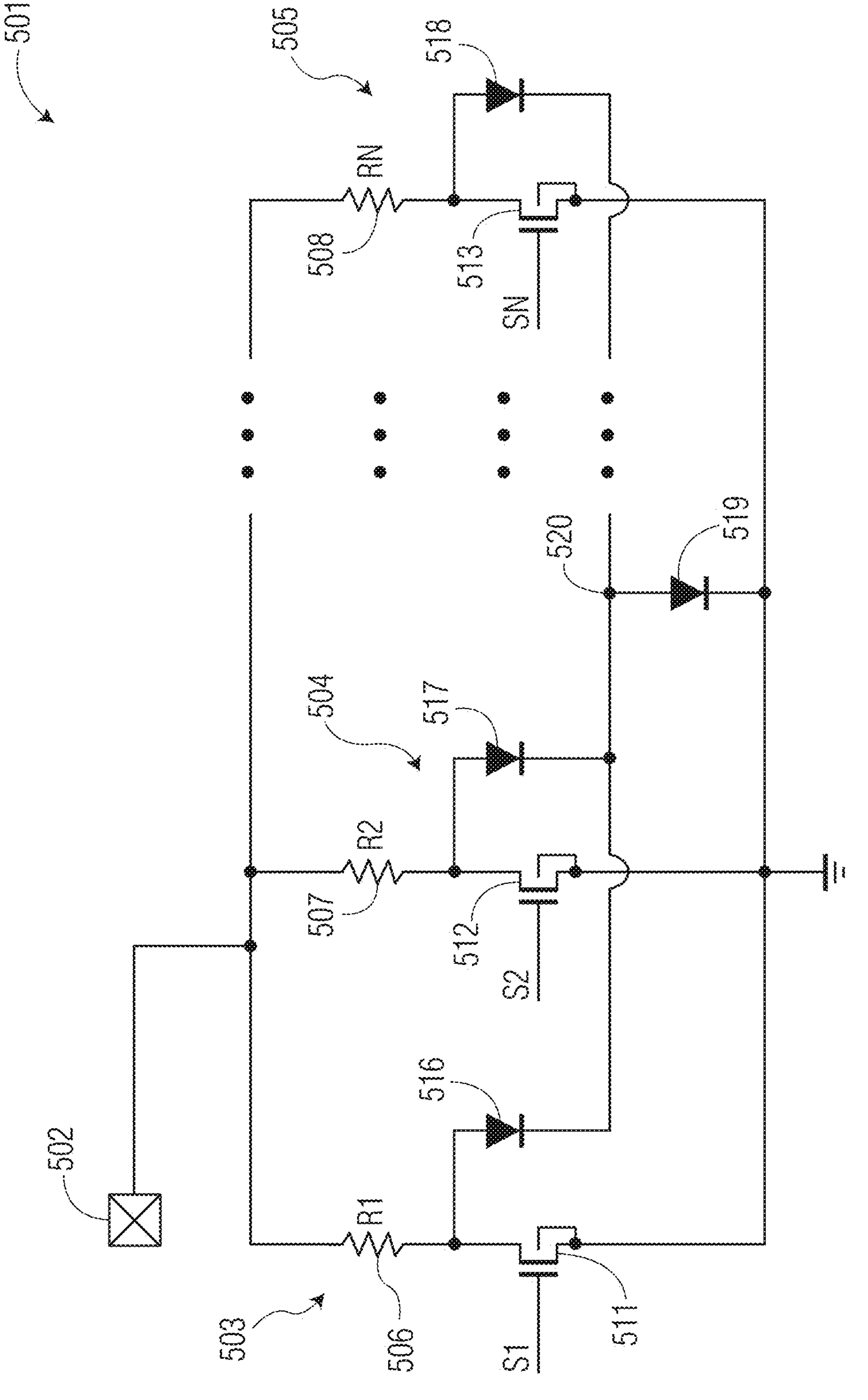
FIG. 5 is a circuit diagram of a termination circuit with ESD circuitry according to one embodiment of the present invention.

FIG. 5 is a circuit diagram of a termination circuit 501 according to another embodiment of the present invention. Termination circuit 501 may be used in place of termination circuits 331, 333, 431, or 433. Termination circuit 501 is connected to signal die terminal 502 and includes multiple termination blocks, with blocks 503-505 shown in FIG. 5. Each termination block (503-505) includes a resistive circuit (506-508) a selection switch (implemented with NFETs 511-513), and a string of one diode (516, 517, and 518). Each selection switch (511, 512, and 513) receives a selection signal (S1, S2, SN, where N is the number of termination blocks in a termination circuit).

The cathodes of each of diodes 516, 517, and 518 are connected to the anode of diode 519. Diode 519 is designed to carry an expected ESD current from an ESD event affecting die terminal 502. Each of diodes 516-518 is individually sized to carry the expected ESD current through its termination block which is determined by the resistance of the resistive circuit (506-508) of the block. Blocks with smaller resistances would have diodes (516-518) with larger current carrying capacity. In some embodiments, each block would include more than one diode in the diode string in a cathode to anode configuration that is connected to the anode of common diode 519. In other embodiments, more than one diode would be located in a common string of diodes between node 520 and the ground terminal.

Figure 6:
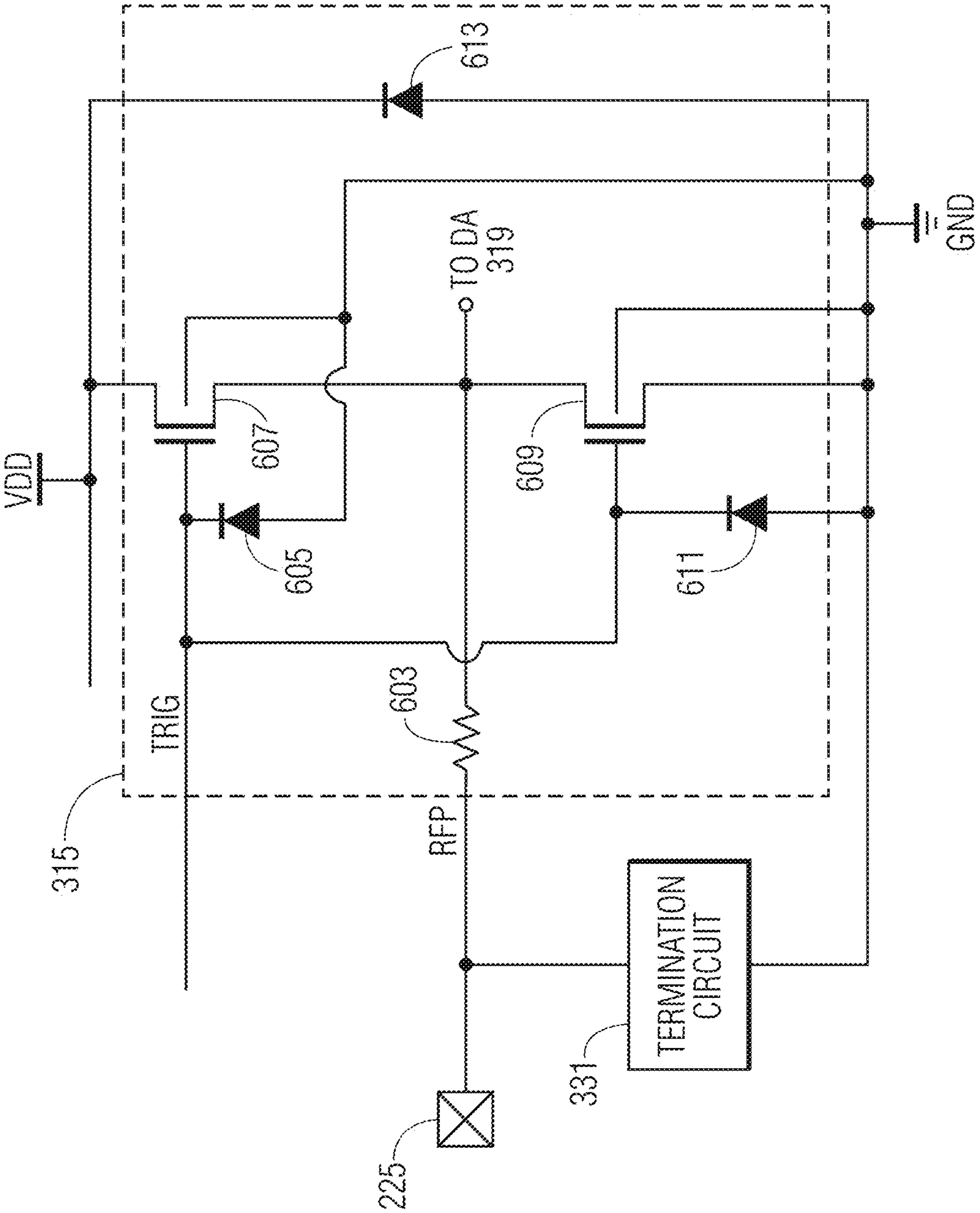
FIG. 6 is a circuit diagram of ESD circuitry according to one embodiment of the present invention.

FIG. 6 is a circuit diagram of ESD circuit 315 according to one embodiment. ESD circuit 317 may also have a similar configuration. Circuit 315 includes a resistive circuit 603 having a first terminal connected to die terminal 225 and connected to termination circuit 331 and a second terminal connected to the non inverting input of differential amplifier 319. Circuit 315 includes clamps 607 and 609 which are implemented with NFETs. Clamps 607 and 609 are made conductive by the assertion of a trigger signal (TRIG) from a trigger circuit (not shown) in response to a detection of an ESD event affecting the VDD terminal. When clamps 607 and 609 are conductive, ESD current is discharged from the VDD terminal to the ground terminal. The body terminal of the NFET of clamp 607 and the body terminal body terminal of the NFET of clamp 609 are connected the ground terminal. Diodes 605 and 611 are connected to the trigger signal line and the ground terminal. Upon detecting an ESD event affecting terminal 225 where the voltage of terminal 225 rises above the voltage of the VDD terminal and the ground terminal, a trigger circuit (not shown) asserts the TRIG signal to make clamps 609 and 607 conductive to discharge ESD current from terminal 225 to the VDD terminal and to the ground terminal. Also, during an ESD event affecting the ground terminal, ESD current will conduct to the VDD terminal through diode 613.

A drain terminal and a source terminal are current terminals for a field effect transistor (FET) and a gate is a control terminal for a FET. As used herein, two devices are coupled to each either other by being connected to each other or by being coupled through another device. For example, referring to FIG. 3, NFET 341 is coupled to resistive circuit 345 at its drain terminal (by being connected) and coupled to die terminal 225 at its drain terminal through resistive circuit 345. A used herein, a "node" of a circuit is a conductive region between two or more circuit devices and designed to have an electric potential that is essentially the same (with at most only a negligible voltage drop) along the region.

Features specifically shown or described with respect to one embodiment set forth herein may be implemented in other embodiments set forth herein.

In one embodiment, an integrated circuit includes a first die terminal configured to convey a first signal and a first termination circuit electrically coupled to the first die terminal to provide a selectable termination resistance to the first die terminal. The first termination circuit includes a plurality of termination blocks. Each termination block of the plurality includes a resistive circuit including a first terminal and a second terminal, the resistive circuit coupled to the first die terminal at its first terminal. Each termination block includes a selection switch including a first current terminal and a second current terminal. The selection switch is coupled to the second terminal of the resistive circuit of the termination block at its first current terminal and coupled to a supply voltage terminal at its second current terminal. The selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal. Each termination block includes a string of one or more diodes connected in series in a cathode to anode configuration. The string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation.

In one embodiment, an integrated circuit includes a first die terminal configured to convey a first signal and a first termination circuit electrically coupled to the first die terminal to provide a selectable termination resistance to the first die terminal. The first termination circuit including a plurality of termination blocks. Each termination block of the plurality includes a resistive circuit and a selection switch coupled to the resistive circuit of the termination block and coupled to a supply voltage terminal. The selection switch including a control terminal to receive a selection signal of a plurality of selection signals, wherein the selection signal is asserted to make the selection switch conductive for implementing a path from the resistive circuit to the supply voltage terminal to implement a resistance of the resistive circuit in the termination resistance of the first die terminal. Each termination block includes a string of one or more diodes connected in series in a cathode to anode configuration. The string is coupled to the resistive circuit at an anode of a first diode of the string and is coupled to the supply voltage terminal at a cathode of the last diode of the string such that the string is located in a path between the resistive circuit and the supply voltage terminal. The string is nonconductive during normal operation. During an ESD event of a sufficient voltage affecting the first die terminal, ESD current flows from the resistive circuit of the termination block through the string to the supply voltage terminal when the selection switch of the termination block is nonconductive.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

We claim:

1. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein for each termination block of the plurality, the cathode of the last diode of the string is connected to the supply voltage terminal.

2. The integrated circuit of claim 1, wherein during an ESD event of a sufficient voltage affecting the first die terminal, ESD current flows from the second terminal of the resistive circuit of a termination block of the plurality through the string to the supply voltage terminal when the selection switch of the termination block is nonconductive.

3. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein a resistive circuit for a first termination block of the plurality is of a first resistance and a resistive circuit of a second termination block of the plurality is of a second resistance that is less than the first resistance, wherein a string of diodes of the first termination block has a smaller current carrying capability than a string of diodes of the second termination block.

4. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein the first signal has an operating frequency of 1000 MHz or greater.

5. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein for each termination block of the plurality, the string of diodes has a cumulative threshold voltage of the one or more diodes of the string that is greater than a greatest operating volage across the selection switch of the termination block from its first current terminal to its second current terminal when the selection switch is nonconductive during normal operation.

6. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein for each termination block of the plurality, a cathode of a last diode of the string is connected to an anode of a first diode of a common string of one or more diodes, wherein a cathode of a last diode of the common string is connected to the supply voltage terminal.

7. The integrated circuit of claim 6 wherein for each termination block of the plurality, the string of one or more diodes has a cumulative threshold voltage of the one or more diodes of the string, the cumulative threshold voltage plus the cumulative threshold voltage of the common string of one or more diodes is greater than a greatest operating volage across the selection switch of the termination block from its first current terminal to its second current terminal when the selection switch is nonconductive during normal operation.

8. The integrated circuit of claim 1 wherein the first signal is characterized as a serial signal.

9. The integrated circuit of claim 1 wherein the integrated circuit receives an external signal at the first die terminal.

10. The integrated circuit of claim 1 wherein the integrated circuit transmits a signal at the first die terminal.

11. The integrated circuit of claim 4 wherein for each termination block of the plurality, the cathode of the last diode of the string is connected to the supply voltage terminal.

12. The integrated circuit of claim 1 wherein the first die terminal is coupled to a first input of a differential amplifier.

13. The integrated circuit of claim 12 wherein the first die terminal is coupled to the input of the differential amplifier through a resistive circuit.

14. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

a second die terminal configured to convey a second signal;

a second termination circuit electrically coupled to the second die terminal to provide a selectable termination resistance to the second die terminal, the second termination circuit including a second plurality of termination blocks, each termination block of the second plurality including:

a resistive circuit including a first terminal and a second terminal, the resistive circuit coupled to the second die terminal at its first terminal;

a selection switch including a first current terminal and a second current terminal, the selection switch coupled to the second terminal of the resistive circuit of the termination block at its first current terminal and coupled to the supply voltage terminal at its second current terminal, the selection switch including a control terminal to receive a selection signal of a second plurality of selection signals, wherein the selection signal is asserted to make the selection switch conductive for implementing a path from the second terminal of the resistive circuit to the supply voltage terminal to implement a resistance of the resistive circuit in a terminal resistance of the second die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation.

15. The integrated circuit of claim 14 wherein the first signal and the second signal are characterized as a differential signal and are complementary signals to each other.

16. The integrated circuit of claim 15 wherein the differential signal is characterized as a serial signal.

17. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein the first signal has an operating frequency in a range of 5000-6000 MHz.

18. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein the diodes of the one or more diodes of the string are characterized as gated diodes.

19. An integrated circuit comprising:

a first die terminal configured to convey a first signal;

a first termination circuit electrically coupled to the first die terminal to provide a selectable termination resistance to the first die terminal, the first termination circuit including a plurality of termination blocks, each termination block of the plurality including:

a resistive circuit including a first terminal and a second terminal, the resistive circuit coupled to the first die terminal at its first terminal;

a selection switch including a first current terminal and a second current terminal, the selection switch coupled to the second terminal of the resistive circuit of the termination block at its first current terminal and coupled to a supply voltage terminal at its second current terminal, the selection switch including a control terminal to receive a selection signal of a plurality of selection signals, wherein the selection signal is asserted to make the selection switch conductive for implementing a path from the second terminal of the resistive circuit to the supply voltage terminal to implement a resistance of the resistive circuit in a terminal resistance of the first die terminal;

a string of one or more diodes connected in series in a cathode to anode configuration, the string is coupled to the resistive circuit at an anode of a first diode of the string and is coupled to the supply voltage terminal at a cathode of the last diode of the string such that the string is located in a path between the resistive circuit and the supply voltage terminal, wherein the string is nonconductive during normal operation;

wherein for each termination block of the plurality, the string of one or more diodes has a cumulative threshold voltage of the one or more diodes of the string that is greater than a greatest operating volage difference between a voltage on the first die terminal and the supply voltage terminal during normal operation.

* * * * *